(12) United States Patent
Yamada et al.

(10) Patent No.: US 11,749,363 B2
(45) Date of Patent: *Sep. 5, 2023

(54) LIQUID DISCHARGE HEAD AND METHOD OF MANUFACTURING THE SAME

(71) Applicant: CANON KABUSHIKI KAISHA, Tokyo (JP)

(72) Inventors: Hiroshi Yamada, Yokohama (JP); Kenta Udagawa, Tokyo (JP); Wataru Takahashi, Yokohama (JP); Norihiro Ikebe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 73 days.

This patent is subject to a terminal disclaimer.

(21) Appl. No.: 17/362,248

(22) Filed: Jun. 29, 2021

(65) Prior Publication Data

US 2021/0327522 A1    Oct. 21, 2021

Related U.S. Application Data

(63) Continuation of application No. 16/848,247, filed on Apr. 14, 2020, now Pat. No. 11,074,984.

(30) Foreign Application Priority Data

Apr. 26, 2019 (JP) ................................ 2019-085962

(51) Int. Cl.
  *G11C 17/00* (2006.01)
  *G11C 17/16* (2006.01)
  (Continued)

(52) U.S. Cl.
  CPC .......... *G11C 17/165* (2013.01); *B41J 2/04541* (2013.01); *G11C 17/18* (2013.01)

(58) Field of Classification Search
  CPC .......... G11C 17/16; G11C 17/18; G11C 17/08; G11C 11/005; G11C 17/165; G11C 17/146; G11C 7/04; H01L 23/5252; H01L 27/0629; H01L 28/20; H01L 23/5228; H01L 23/528; H01L 27/0207; H01L 29/7817; H01L 27/0266; H10B 20/20
  See application file for complete search history.

(56) References Cited

U.S. PATENT DOCUMENTS 5,610,635 A    3/1997 Murray
6,390,589 B1   5/2002 Imanaka
(Continued)

FOREIGN PATENT DOCUMENTS

CN    1576018 A    2/2005
CN    1847005 A    10/2006
(Continued)

*Primary Examiner* — Thong Q Le
(74) *Attorney, Agent, or Firm* — Canon U.S.A., Inc. I.P. Division (57) ABSTRACT

A liquid discharge head having an element board including an element configured to discharge a liquid includes a first storage element and a second storage element. The first storage element is a fuse element or an anti-fuse element. The second storage element is a semiconductor memory capable of holding a larger capacity than the first storage element. The second storage element is provided on an area other than the element board.

15 Claims, 7 Drawing Sheets

(51) Int. Cl.
*B41J 2/045* (2006.01)
*G11C 17/18* (2006.01)

(56) References Cited

U.S. PATENT DOCUMENTS

| | | | |
|---|---|---|---|
| 11,074,984 B2 * | 7/2021 | Yamada | ............... B41J 2/17513 |
| 2014/0225946 A1 † | 8/2014 | Quinn | |

FOREIGN PATENT DOCUMENTS

| | | | |
|---|---|---|---|
| CN | 1853934 A | | 11/2006 |
| CN | 1960876 A | | 5/2007 |
| CN | 101898454 A | | 12/2010 |
| CN | 102253636 B | † | 1/2013 |
| CN | 105818542 A | | 8/2016 |
| CN | 207549746 U | | 6/2018 |
| JP | 2005-297311 A | | 10/2005 |
| JP | 2013-202885 A | | 10/2013 |
| TL | 2019/009904 A1 | | 1/2019 |

\* cited by examiner
† cited by third party

LIQUID DISCHARGE HEAD AND METHOD OF MANUFACTURING THE SAME

CROSS-REFERENCE TO RELATED APPLICATIONS

The present application is a continuation of U.S. patent application Ser. No. 16/848,247, filed on Apr. 14, 2020, which claims priority from Japanese Patent Application No. 2019-085962 filed Apr. 26, 2019, which are hereby incorporated by reference herein in their entireties.

BACKGROUND OF THE INVENTION

Field of the Invention

The present disclosure relates to a liquid discharge head and a method of manufacturing the same.

Description of the Related Art

Conventionally, it is known to mount a read only memory (ROM) on an element board to ensure that information unique to a liquid discharge head, including a driving characteristic of a liquid discharge mechanism such as an element for discharging liquid, is held in a liquid discharge head. The driving characteristic of the liquid discharge mechanism differs from each liquid discharge head, and thus, using the ROM mounted on the element board makes it possible to provide a correction for each liquid discharge head to achieve the optimal discharge driving, based on the information unique to the liquid discharge head stored in the ROM.

Japanese Patent No. 3428683 discusses that a fuse element serving as a ROM is formed on an element board of a liquid discharge head. Blowing the fuse element selectively causes binary data to be held in the liquid discharge head depending on whether the fuse element is blown.

The fuse element or the like mounted on the element board discussed in Japanese Patent No. 3428683 has a small storage capacity for holding information. Therefore, many fuse elements need to be mounted on the element board to store a large amount of data including an identity (ID) code of the liquid discharge head itself. As a result, the element board may be increased in size.

SUMMARY OF THE INVENTION

The present disclosure is directed to a liquid discharge head capable of increasing a capacity of information held by the liquid discharge head while suppressing an element board from increasing in size and a method of manufacturing the liquid discharge head.

According to an aspect of the present disclosure, a liquid discharge head having an element board including an element configured to discharge a liquid includes a first storage element and a second storage element, wherein the first storage element is a fuse element or an anti-fuse element, wherein the second storage element is a semiconductor memory capable of holding a larger capacity than the first storage element, and wherein the second storage element is provided on an area other than the element board.

Further features of the present disclosure will become apparent from the following description of exemplary embodiments with reference to the attached drawings.

DESCRIPTION OF THE EMBODIMENTS

Exemplary embodiments of the present disclosure will be described in detail below.

Liquid Discharge Head

Figure 1A:
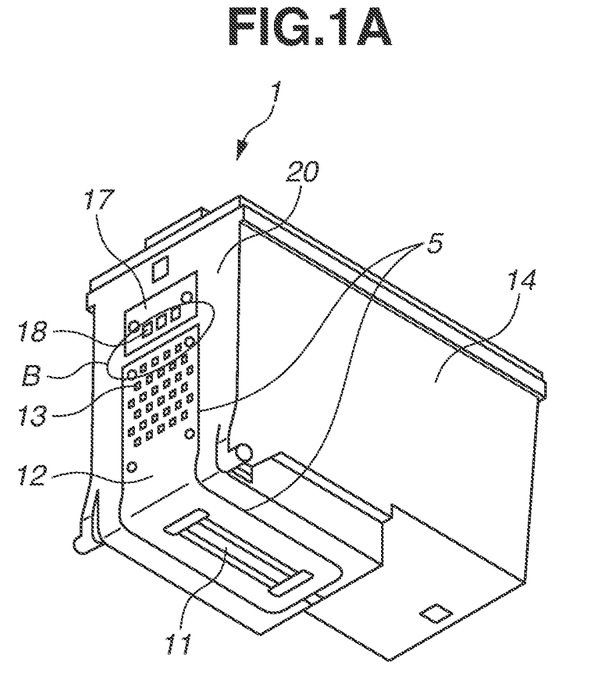
FIGS. 1A and 1B are perspective views each illustrating a liquid discharge head.
Figure 1B:
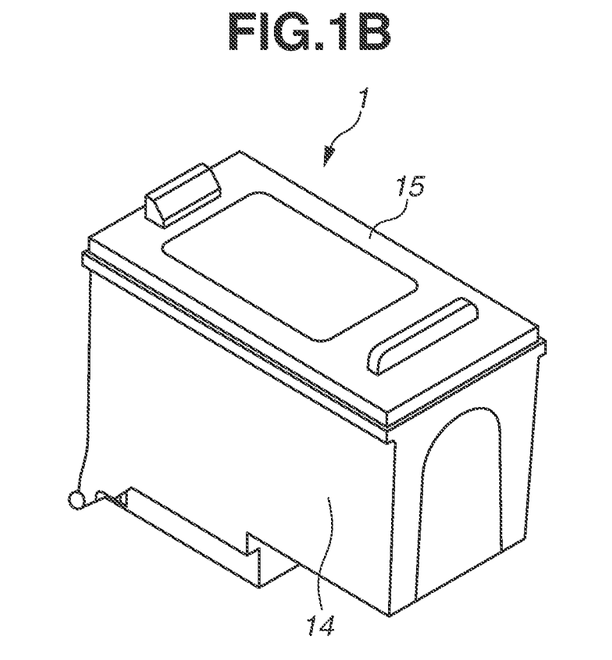
Figure 6A:
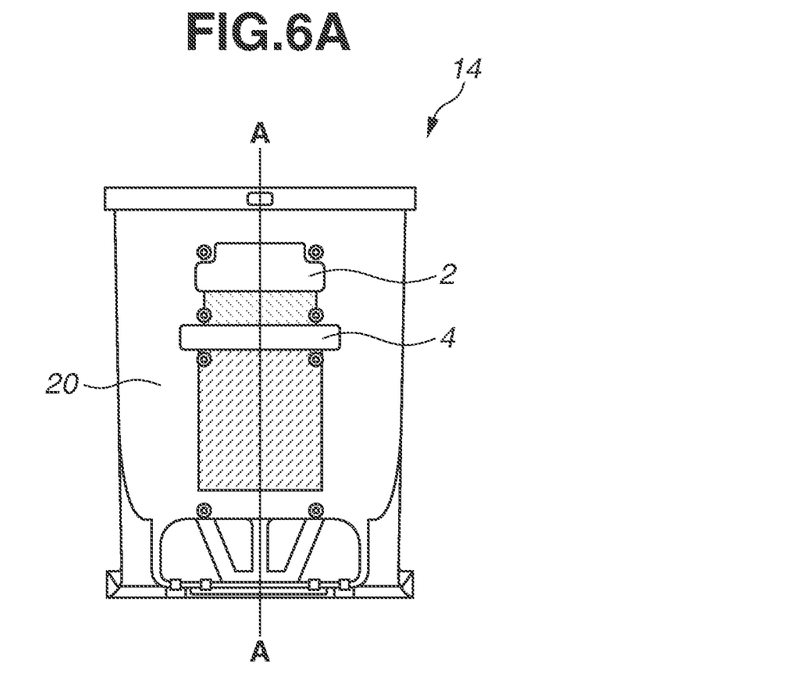
FIGS. 6A and 6B each illustrate a housing.
Figure 6B:
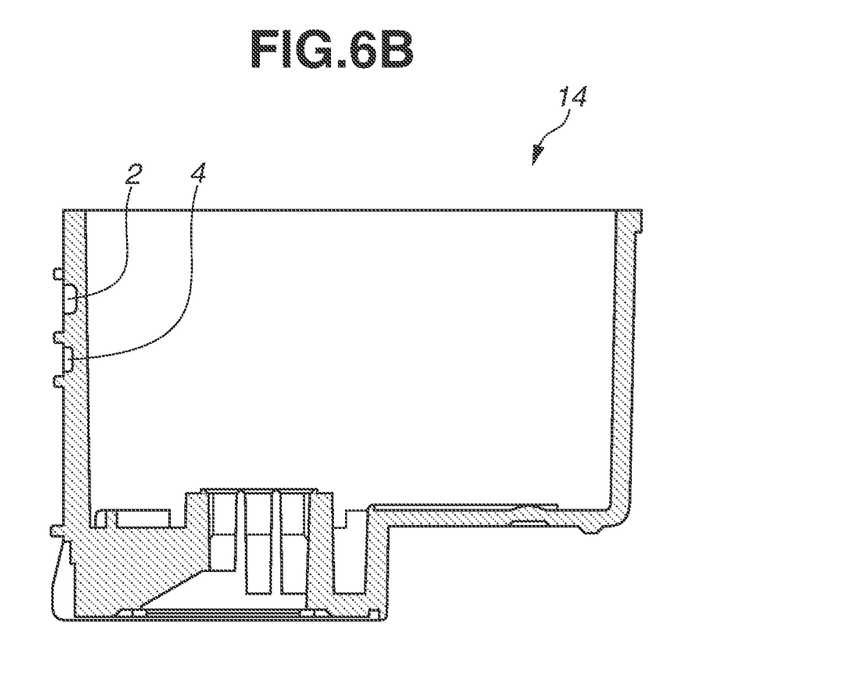

A liquid discharge head according to the present exemplary embodiment will be described with reference to FIGS. 1A and 1B, FIGS. 6A and 6B, and FIGS. 7A and 7B. FIG. 1A is an external perspective view where a liquid discharge head 1 according to the present exemplary embodiment is viewed from a side of an element board 11, and FIG. 1B is an external perspective view where the liquid discharge head 1 is viewed from a side of a cover member 15. FIG. 6A is a plan view illustrating a surface 20 of a housing 14 where a first electric wiring board 12, a second electric wiring board 17, and the like are omitted. FIG. 6B is a drawing illustrating a cross section taken along A-A illustrated in FIG. 6A. The liquid discharge head 1 mainly includes the element board 11 configured to discharge liquid, the first electric wiring board 12 electrically connected to the element board 11, the second electric wiring board 17, the housing 14, and the cover member 15. A first terminal 13 is provided on the first electric wiring board 12, and an electric signal from a recording device body is transmitted to the element board 11 via the first terminal 13. A semiconductor memory (integrated circuit (IC) memory) 19 (see FIG. 4) serving as a second storage element is attached to the second electric wiring board 17, and electrical communication between the recording device body and the semiconductor memory 19 is performed via a second terminal 18 provided on the second electric wiring board 17. The element board 11, the first electric wiring board 12, and the second electric wiring board 17 are bonded to the housing 14. A liquid is stored inside the housing 14, and supply of the liquid to the element board 11 causes a discharge port provided on the element board 11 to discharge the liquid.

Figure 2:
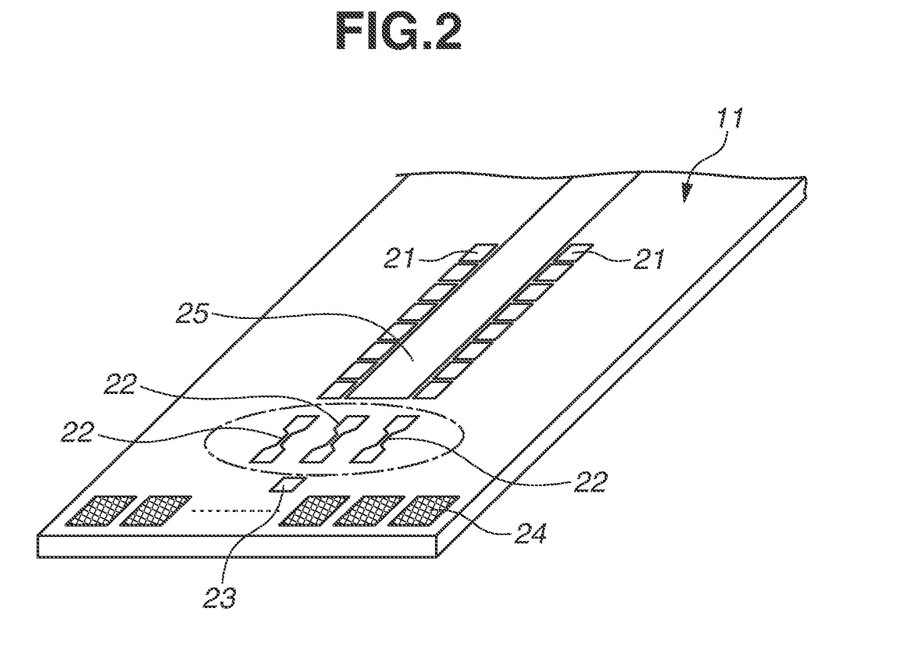
FIG. 2 is a schematic diagram illustrating an element board.

The element board 11 is provided with a fuse element or an anti-fuse element serving as a first storage element, which will be described in detail below. The element board 11 mounted with a fuse element 22 serving as the first storage element is illustrated in FIG. 2, which will be described below. The semiconductor memory 19 described above is mounted in the housing 14, in addition to the fuse element 22, as a component where information can be stored. This allows the liquid discharge head 1 to hold a large amount of information without a need of mounting a larger number of fuse elements 22 on the element board 11. Therefore, according to the present disclosure, it is possible to increase the capacity of information held by the liquid discharge head 1 while suppressing the element board 11 from increasing in size. A reason why the semiconductor memory 19 is employed for the second storage element is that a semiconductor memory has a high storage density per volume and is resistant to vibration.

The second electric wiring board 17 is mounted on the same surface as a surface of the housing 14 on which the first terminal 13 of the first electric wiring board 12 is arranged, that is, mounted on the surface 20. As a result, the first terminal 13 and the second terminal 18 are arranged on the same surface of the housing 14, and thus, a configuration of a portion of the recording device body, with which the first terminal 13 and the second terminal 18 come into contact when the liquid discharge head 1 is attached to the recording device body, can be simplified. In the present exemplary embodiment, the semiconductor memory 19 is provided on the surface 20, but the present disclosure is not limited to this. That is, it can suffice that the semiconductor memory 19 is provided on an area other than the element board 11. Being provided on an area other than the element board 11 means that the semiconductor memory 19 is provided neither on the element board 11 nor inside the element board 11. In a posture in which the liquid discharge head 1 is attached to the recording device body (a posture in which a surface formed with the discharge port of the element board 11 faces in a vertically downward direction), the second electric wiring board 17 is arranged in a vertically upper direction of the first electric wiring board 12. The first electric wiring board 12 is formed of a member easily processable to be bent along a shape of the housing 14.

As illustrated in FIGS. 6A and 6B, the housing 14 desirably includes a first concave part 2 formed at a location where the semiconductor memory 19 is mounted. The reason for this is that, when the semiconductor memory 19 is inserted into the first concave part 2, it is possible to prevent the location of the semiconductor memory 19 from protruding from the surface 20. If the location of the semiconductor memory 19 protrudes from the surface 20, a configuration of the recording device body needs to be adjusted to match such protruding portion to stably fit the liquid discharge head 1 into the recording device body. However, when the semiconductor memory 19 is inserted into the first concave part 2, the surface 20 becomes substantially flat, and the configuration of the recording device body to fit the liquid discharge head 1 can be simplified. It is more desirable that a sealing material is injected into the first concave part 2 and the semiconductor memory 19 is inserted into the first concave part 2 injected with the sealing material. As a result, the semiconductor memory 19 is sealed with the sealing material, and thus, it is possible to suppress a liquid from touching the semiconductor memory 19. The injecting the sealing material into the first concave part 2 also has an effect of temporarily fixing the semiconductor memory 19.

Figure 7A:
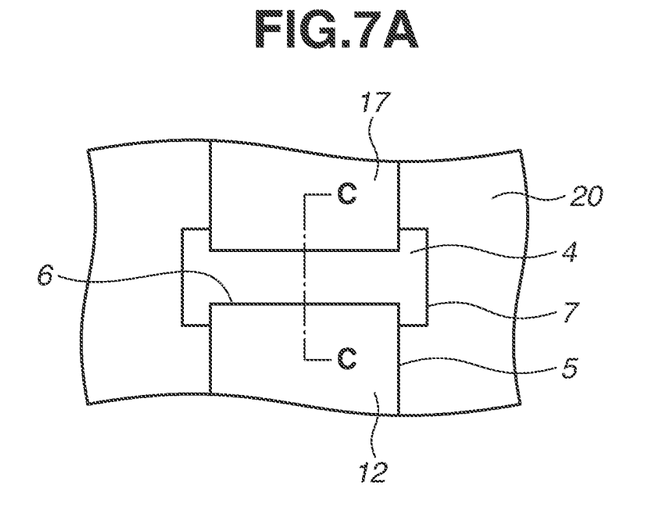
FIGS. 7A and 7B are enlarged schematic diagrams each illustrating a concave part and its surrounding area of the housing.
Figure 7B:
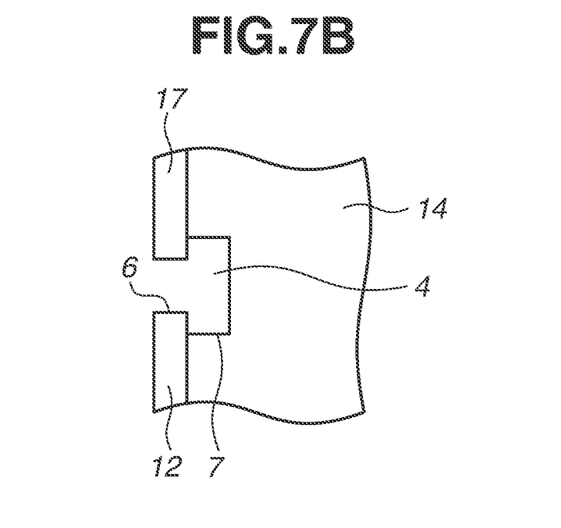

FIG. 7A is an enlarged view of a region B illustrated in FIG. 1A, and FIG. 7B is a schematic cross section view taken along C-C illustrated in FIG. 7A. The liquid discharged from the element board 11 may travel along an edge 5 (in FIG. 1) of the first electric wiring board 12 and move up to an end 6 of the first electric wiring board 12. Here, a flexible board (flexible printed circuit (FPC)) is often employed for the first electric wiring board 12, and the end 6 of the flexible board has a portion where wiring in the flexible board is exposed. Therefore, when the liquid from the element board 11 is transmitted to such a flexible board, the liquid may come into contact with the end 6 of the flexible board, thereby leading to malfunction of the flexible board.

Therefore, in the present exemplary embodiment, a second concave part 4 is desirably formed in the housing 14 at a position corresponding to the end 6 on a side (side where the first terminal 13 is arranged) where the wiring of the flexible board is exposed. As a result, as illustrated in FIG. 7B, the end 6 of the flexible board floats in the air to protrude from an end of an opening 7 of the second concave part 4 toward the second electric wiring board 17. Accordingly, even if the liquid is transmitted along the edge 5 of the flexible board, the liquid does not climb up beyond the end of the opening 7 of the second concave part 4, thereby suppressing the liquid from contacting the end 6 of the flexible board.

The same can be said for a case where a flexible board (FPC) is employed for the second electric wiring board 17. That is, as illustrated in FIG. 7B, the second electric wiring board 17 is arranged so that an end on a side (side closer to the first electric wiring board 12) where the wiring of the second electric wiring board 17 is exposed protrudes from an end of the opening 7 of the second concave part 4 toward the first electric wiring board 12. Accordingly, it is possible to suppress the liquid from contacting the second electric wiring board 17. If the end of the second electric wiring board 17 does not protrude from the end of the opening 7 and is located near the opening 7, the liquid from the element board 11 may possibly contact the end of the second electric wiring board 17. This is because the liquid flowing from the element board 11 to the opening 7 along the edge 5 of the first electric wiring board 12 may possibly flow along an edge of the opening 7 to reach the end of the second electric wiring board 17.

In order that the liquid does not contact the end of the second electric wiring board 17, a concave part different from the second concave part 4 can be provided under the end of the second electric wiring board 17. However, in this case, a total of three concave parts including the first concave part 2 and the second concave part 4 need to be formed on the surface 20 of the housing 14, and this may increase the size of the housing 14. Therefore, it is desirable that the second electric wiring board 17 is arranged on the surface 20 so that the end of the second electric wiring board 17 protrudes from the end of the opening 7 of the second concave part 4, and a concave part to be provided under the end of the second electric wiring board 17 and a concave part to be provided under the end 6 of the first electric wiring board 12 are used in common. As a result, it is possible to suppress the housing 14 from increasing in size.

As described above, in the present exemplary embodiment, the elements capable of storing information include two elements, that is, the fuse element 22 and the semiconductor memory 19, and thus, information including an ID code and a production date of the liquid discharge head 1, and a remaining amount of liquid can be written into the semiconductor memory 19. Only information unique to the liquid discharge head 1 that is to be measured during a manufacturing process of the liquid discharge head 1 can be written into the fuse element 22, which will be described in detail below. Thus, the information to be stored in the fuse element 22 is limited, saving a capacity of the fuse element 22. The reason why the two electric wiring boards, that is, the first electric wiring board 12 and the second electric wiring board 17, are prepared is that the semiconductor memory 19 is desirably mounted in the liquid discharge head 1 at a near-final stage where the manufacturing process of the liquid discharge head 1 described below is completed.

Element Board

The element board 11 according to the present exemplary embodiment will be described with reference to FIG. 2. FIG. 2 is a schematic diagram of the element board 11 according to the present exemplary embodiment. The element board 11 mainly includes an element 21, the fuse element 22, a temperature sensor 23, an electrode pad 24, and a liquid supply port 25. The liquid supply port 25 is formed substantially at a center of the element board 11, and the element 21 includes a plurality of the elements 21 arranged on both sides of the liquid supply port 25. The element 21 heats the liquid in response to a drive signal to generate bubbles in the liquid, and discharges liquid droplets from a discharge port (not illustrated) by a foaming pressure of the bubbles.

Figure 3:
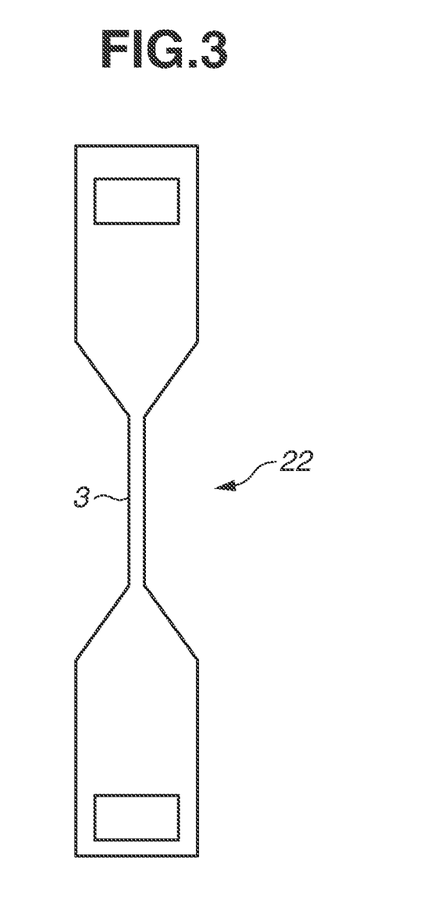
FIG. 3 is a schematic diagram illustrating a fuse element.

The drive signal is sent from the recording device body to the element board 11 via the electrode pad 24 and the first terminal 13 provided on the first electric wiring board 12. The fuse element 22 includes the three fuse elements 22 in FIG. 2, and an enlarged view of the fuse element 22 is provided in FIG. 3. The fuse element 22 has a region 3 having a narrow wiring width. When a voltage is applied to the fuse element 22, the region 3 is blown. Depending on whether the region 3 is blown, binary data indicating whether a current flows through the fuse element 22 can be stored. Although the fuse element 22 is illustrated as a storage element mounted on the element board 11, an anti-fuse element can be mounted on the element board 11. The anti-fuse element has a first resistance value before information is written and has a second resistance value smaller than the first resistance value after the information is written. The larger the first resistance value, the more desirable. Ideally, the first resistance value can be infinite. Further, the larger a difference between the first resistance value and the second resistance value, the more desirable. For example, the anti-fuse element functions as a capacitance element before information is written and functions as a resistance element after information is written.

Second Electric Wiring Board

Figure 4:
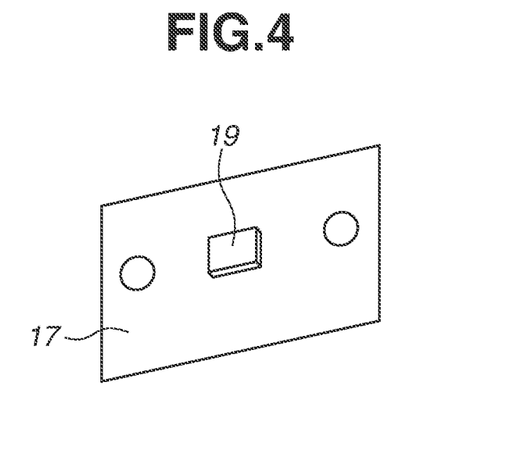
FIG. 4 is a schematic diagram illustrating a second electric wiring board.

It may suffice that the second storage element (semiconductor memory 19 in this case) is provided outside the element board 11, but it is desirable that the liquid discharge head 1 includes the second electric wiring board 17 different from the first electric wiring board 12 and the second storage element is provided on the second electric wiring board 17. The second electric wiring board 17 will be described with reference to FIG. 4. FIG. 4 is a schematic diagram when the second electric wiring board 17 is viewed from a back side. A storage capacity of the semiconductor memory 19 mounted on the second electric wiring board 17 is larger than a storage capacity of the fuse element 22. The semiconductor memory 19 stores information other than the information stored in the fuse element 22, and thus, this feature is desirable in a case where the liquid discharge head 1 needs to hold more information, which will be described in detail below. The second terminal 18 and the semiconductor memory 19 are connected by wiring provided in the second electric wiring board 17. This connection is a solder connection or the like, and thus, it is desirable that a member of the second electric wiring board 17 is different from a member of the first electric wiring board 12 and uses a member having relatively high heat resistance.

Manufacturing Process

Figure 5:
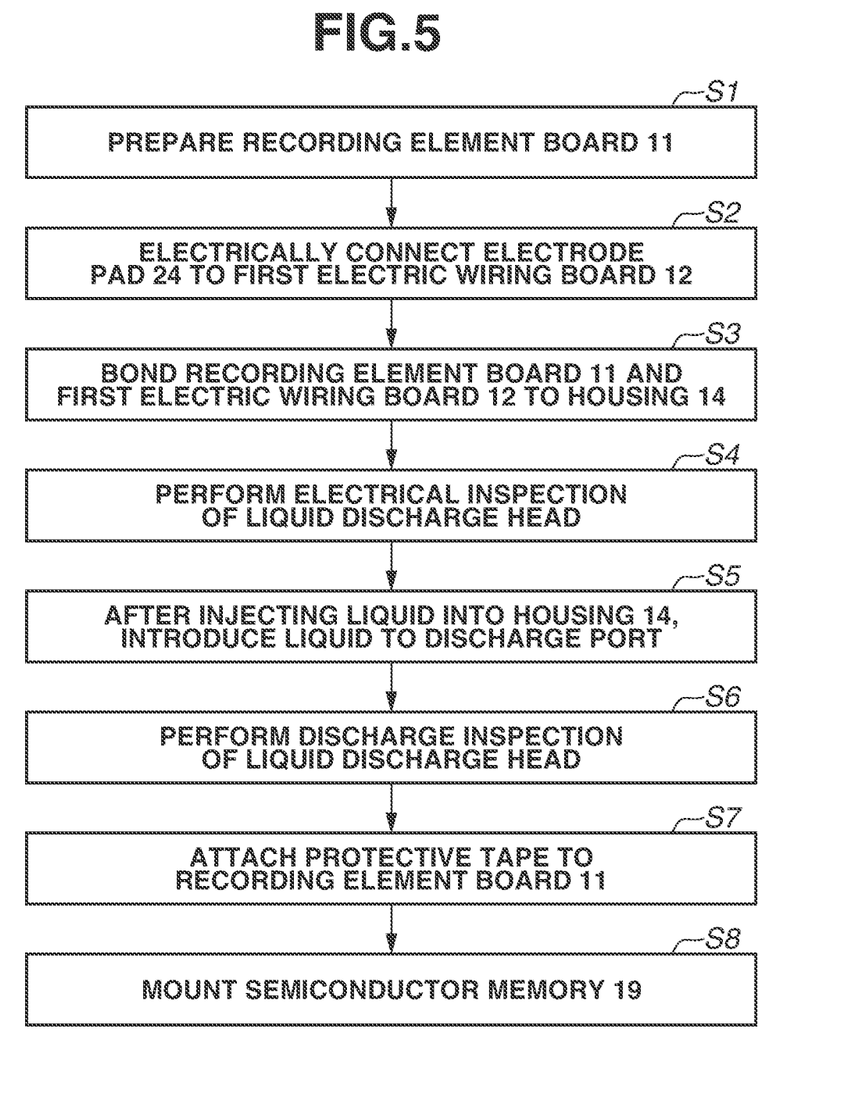
FIG. 5 is a flowchart illustrating a manufacturing process.

A manufacturing process of the liquid discharge head 1 will be described with reference to FIG. 5. FIG. 5 is a flowchart illustrating a manufacturing process of the liquid discharge head 1. In step S1, firstly, the element board 11 including the fuse element 22 is prepared. Here, a discharge port member or the like including a discharge port has been already formed on the element board 11. In step S2, the electrode pad 24 of the element board 11 is electrically connected to the first electric wiring board 12 by, for example, a wire bonding method. In step S3, the first electric wiring board 12 and the element board 11, which are electrically connected each other, are bonded to the housing 14 with an adhesive agent.

At this time, the semiconductor memory 19, which is relatively expensive, is not mounted in the liquid discharge head 1. In the manufacturing process of the liquid discharge head 1, there is a defective liquid discharge head during the manufacture. Examples of its cause include a discharging failure in which the liquid discharge head turbulently discharges a liquid and an electrical failure in which the liquid discharge head cannot normally perform electrical operations. Thus, such a liquid discharge head does not operate normally, and thus, cannot be shipped. Therefore, if the semiconductor memory 19 is mounted in the housing 14 at this time, the liquid discharge head needs to be discarded together with the semiconductor memory 19 even if the semiconductor memory 19 itself is normal. In other words, it is detrimental in terms of cost. Accordingly, the semiconductor memory 19 is not mounted in the housing 14 at a relatively early stage in the manufacturing process.

In step S4, an electric signal is applied from the first terminal 13 to the element board 11 to perform an electrical inspection of the liquid discharge head 1. In this step, a characteristic of the temperature sensor 23 arranged on the element board 11 is also measured. The characteristic of the temperature sensor 23 differs depending on each liquid discharge head 1. Accordingly, when the characteristic of the temperature sensor 23 is measured, it is possible to calculate a temperature correction value unique to the liquid discharge head 1 and to write temperature sensor characteristic data into the fuse element 22 of each liquid discharge head 1. When the recording device body reads the temperature sensor characteristic data, it is possible to correct an output value of the temperature sensor 23, which allows the recording device body to control the liquid discharge head 1 at an optimum temperature. Thus, in the manufacturing process of the liquid discharge head 1, the data unique to the liquid discharge head 1 is measured, and at the same time, that data can be stored in the element board 11 of the liquid discharge head 1. This feature is a beneficial point of the fuse element 22.

A liquid absorber is inserted into the housing 14 and the liquid (ink) is injected into the liquid absorber, and then, the housing 14 is covered with the cover member 15. In step S5, the injected liquid is then sucked from the discharge port or the like to introduce the liquid to the discharge port of the element board 11 so that the liquid can be discharged.

In step S6, a discharge inspection is performed. In the discharge inspection, the liquid discharge head 1 is actually driven to discharge the liquid, and whether there is any discharging failure is checked and a driving characteristic of the element 21 optimal for discharging the liquid is measured at the same time. The driving characteristic of the element 21 is also data unique to the liquid discharge head 1, and thus, simultaneously with the measurement, the data is stored in the fuse element 22 of the element board 11. When the liquid is actually discharged from the discharge port, a drive voltage to be supplied to the element 21 is adjustable by the recording device body reading the drive characteristic of the element 21.

In step S7, a protective tape for protecting a discharge port surface is attached to the discharge port surface. In step S8, the second electric wiring board 17 having the semiconductor memory 19 is mounted on the liquid discharge head 1. The second electric wiring board 17 having the semiconductor memory 19 is fixed by thermal caulking or the like to the surface 20 of the housing 14 where the first terminal 13 of the first electric wiring board 12 is located. At this time, in a case where the above-described first concave part 2 is formed in the housing 14, the semiconductor memory 19 is inserted into the first concave part 2 after a sealing material is injected into the first concave part 2 and the semiconductor memory 19 is mounted in the housing 14. The characteristic data of the temperature sensor 23 and the characteristic data of the element 21, which are the information unique to the liquid discharge head 1, are read from the fuse element 22 in the element board 11. The read data is written into the semiconductor memory 19 via the second terminal 18 of the second electric wiring board 17. At this time, in addition to the data stored in the fuse element 22, information, having a large amount of information, including an ID code of the liquid discharge head 1 is also written into the semiconductor memory 19. This is because the semiconductor memory 19 having a larger storage capacity than the fuse element 22 is used, and thus, information other than the data unique to the liquid discharge head 1 can be written.

Finally, the liquid discharge head 1 mounted with the semiconductor memory 19 is packed with a packing material. This completes the manufacture of the liquid discharge head 1. According to the liquid discharge head 1 manufactured by the above manufacturing method, only the information unique to the liquid discharge head 1 measured in the manufacturing step is stored in the fuse element 22 in the element board 11, thereby preventing the element board 11 from increasing in size. Further, as a large-capacity semiconductor memory is mounted at the near-final stage in a series of manufacturing process, the semiconductor memory 19 is mounted only in the liquid discharge head 1 determined to be good, thereby resulting in a reduced cost. Furthermore, it takes a longer time to write information into the fuse element 22 than into the semiconductor memory 19. Therefore, a large amount of information including the ID code of the liquid discharge head 1 is stored in the semiconductor memory 19 and only minimum information such as the characteristic data of the temperature sensor 23 is stored in the fuse element 22, thereby resulting in a reduction in manufacturing time.

In the above description of the present exemplary embodiment, the information in the fuse element 22 is read and written into the semiconductor memory 19; however, if a data reading circuit of the recording device body can read the data from both of the fuse element 22 and the semiconductor memory 19, the information in the fuse element 22 need not be read and written into the semiconductor memory 19. In that case, the capacity of the semiconductor memory 19 is saved, and thus, other information can be written into the semiconductor memory 19.

According to the present disclosure, it is possible to prevent the element board from increasing in size and to increase the capacity of information to be held by the liquid discharge head.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:
1. A liquid discharge head having an element board including an element configured to discharge a liquid, the liquid discharge head comprising:
 a first storage element, wherein the first storage element is a fuse element or an anti-fuse element; and
 a second storage element, wherein the second storage element is a semiconductor memory with a larger capacity than a capacity of the first storage element,
 wherein the first storage element is provided on the element board, and
 wherein the second storage element is provided on an area other than the element board.

2. The liquid discharge head according to claim 1, further comprising:
 a first electric wiring board including a first terminal electrically connected to the first storage element; and
 a second electric wiring board including the second storage element.

3. The liquid discharge head according to claim 2,
 wherein the liquid discharge head includes a housing,
 wherein the second electric wiring board includes a second terminal electrically connected to the second storage element, and
 wherein the first terminal and the second terminal are arranged on a same surface of the housing.

4. The liquid discharge head according to claim 2, wherein the first electric wiring board and the second electric wiring board are flexible boards.

5. The liquid discharge head according to claim 1, wherein the second electric wiring board is arranged in a vertical upper direction of the first electric wiring board, in a posture in which the liquid discharge head is mounted in a recording device body.

6. The liquid discharge head according to claim 4,
 wherein the housing includes a first concave part on a surface on which the second storage element is arranged, and
 wherein the second storage element is inserted into the first concave part.

7. The liquid discharge head according to claim 4,
 wherein the housing includes a second concave part on a same surface,
 wherein an end of the first electric wiring board on a side where a wiring included in the first electric wiring board is exposed protrudes from an opening of the second concave part, and
 wherein an end of the second electric wiring board on a side where a wiring included in the second electric wiring board is exposed protrudes from the opening of the second concave part.

8. A method of manufacturing a liquid discharge head, comprising:
 preparing an element board provided with a first storage element that is a fuse element or an anti-fuse element, the element board being configured to discharge a liquid;
 inspecting the element board; and
 mounting a second storage element, after inspecting the element board, which is a semiconductor memory with a larger capacity than the first storage element, on an area other than the element board.

9. The method of manufacturing a liquid discharge head according to claim 8, further comprising writing information stored in the first storage element into the second storage element after mounting the second storage element.

10. The method of manufacturing a liquid discharge head according to claim 8, wherein the liquid discharge head further comprising:
 a first electric wiring board including a first terminal electrically connected to the first storage element; and
 a second electric wiring board including the second storage element.

11. The method of manufacturing a liquid discharge head according to claim 8,
 wherein the liquid discharge head includes a housing,
 wherein the second electric wiring board includes a second terminal electrically connected to the second storage element, and wherein the first terminal and the second terminal are arranged on a same surface of the housing.

12. The method of manufacturing a liquid discharge head according to claim 8, wherein the first electric wiring board and the second electric wiring board are flexible boards.

13. The method of manufacturing a liquid discharge head according to claim 12,
    wherein the housing includes a first concave part on a surface on which the second storage element is arranged, and
    wherein the method further comprises, in mounting the second storage element, inserting the second storage element into the first concave part.

14. The method of manufacturing a liquid discharge head according to claim 13, further comprising, in mounting the second storage element, inserting the second storage element into the first concave part after a sealing material is injected into the first concave part.

15. The method of manufacturing a liquid discharge head according to claim 12, further comprising:
    arranging the first electric wiring board on a same surface of the housing so that an end on a side where a wiring included in the first electric wiring board is exposed protrudes from an opening of the second concave part, after preparing the element board; and
    arranging the second electric wiring board on the same surface of the housing so that an end on a side where a wiring included in the second electric wiring board is exposed protrudes from an opening of the second concave part, in mounting the second storage element,
    wherein the housing includes a second concave part on the same surface.

* * * * *